United States Patent [19]

Yanagawa et al.

[11] Patent Number: 5,100,767
[45] Date of Patent: Mar. 31, 1992

[54] PHOTOPOLYMERIZABLE LIQUID PHOTOIMAGEABLE SOLDER MASK

[75] Inventors: Makoto Yanagawa, Kamifukuoka; Shinji Santo, Tokorozawa, both of Japan

[73] Assignee: Tamura Kaken Co., Ltd., Saitama, Japan

[21] Appl. No.: 452,781

[22] Filed: Dec. 19, 1989

[30] Foreign Application Priority Data

Dec. 27, 1988 [JP] Japan .................. 63-332162

[51] Int. Cl.⁵ .................. G03F 7/004; G03F 7/039
[52] U.S. Cl. .................. 430/280; 522/100; 522/103
[58] Field of Search .................. 522/100, 103; 430/280

[56] References Cited

U.S. PATENT DOCUMENTS

| | | | |
|---|---|---|---|
| 3,989,610 | 11/1976 | Tsukada et al. | 430/280 |
| 4,146,452 | 3/1979 | Weber et al. | 522/100 X |
| 4,358,477 | 11/1982 | Nooman et al. | 522/100 X |
| 4,725,524 | 2/1988 | Elzer et al. | 522/100 X |
| 4,943,516 | 7/1990 | Kamayachi et al. | 430/280 |
| 4,948,700 | 8/1990 | Maeda et al. | 430/281 X |
| 5,009,982 | 4/1991 | Kamayachi et al. | 522/103 X |

Primary Examiner—Cynthia Hamilton
Attorney, Agent, or Firm—Felfe & Lynch

[57] ABSTRACT

The present invention provides a photopolymerizable composition useful as a liquid photoimageable solder mask comprising (a) a reaction product obtained by reacting epoxy resin A containing at least two terminated epoxy groups with 0.8 to 1.2 mol, per 1 epoxy equivalent of epoxy resin A, of an α,β-unsaturated carboxylic acid and then reacting same with 0.2 to 1.0 mol, per 1 epoxy equivalent of epoxy resin A, of polybasic acid anhydride, (b) diluent, (c) sensitizer, (d) epoxy resin B consisting of tris (2,3-epoxypropyl) isocyanurate whose melting point is 130° C. or less, and (e) an epoxy resin curing agent represented by the general formula [I:]

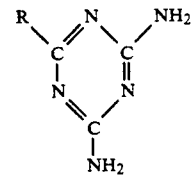

wherein R is —H, halogen, —NH$_2$, —SH, aromatic hydrocarbon, a C$_1$-C$_4$ alkyl group or NHR' (R' is a C$_1$-C$_4$ alkyl group having —CN or NH$_2$C=NH).

14 Claims, No Drawings

PHOTOPOLYMERIZABLE LIQUID PHOTOIMAGEABLE SOLDER MASK

BACKGROUND OF THE INVENTION

1. Field of the Invention

The present invention relates to a photopolymerizable composition and, more particularly, to a photopolymerizable composition useful as a liquid photoimageable solder mask which is superior in ultraviolet rays curability and solder heat resistance, said composition being able to form images by the steps of ultraviolet rays exposure, after film-forming, and development by a diluted alkali aqueous solution.

2. Description of the Related Art

Printed wiring boards are often used to mount electronic devices compactly. The printed wiring board is produced by etching a copper foil bonded onto a laminate according to the circuit wiring and is soldered after arrangement of the electronic devices at a predetermined position.

A solder mask is usually applied before soldering the electronic devices to the printed wiring board and is coated to form a film in all areas except the areas where circuit conductors are soldered. This film is indispensable because it functions not only as an insulating membrane preventing the solder from adhering to unnecessary areas during the soldering, but also as a protective membrane preventing the circuit conductor from being corroded by oxidation or moisture after exposure to the air.

Hitherto, the solder mask have been formed on the board by screen-printing same and curing the print by ultraviolet rays or heat. However, not only has the printed board been steadily refined, enlarged and made into one-board, thus becoming more advanced with remarkable tempo, but also its mounting methods have evolved into a surface mount technology (SMT), and therefore the solder mask is also required to be of higher resolution, accuracy and reliability to accompany the refined SMT. Various improvements in the solder mask have been proposed from a screen printing method to a liquid photoimageable solder mask method, which are superior in the positional accuracy and the covering power on the conductor edge regardless of the boards of conventional or professional use. For example, a solder mask composition comprised of bis-phenol type epoxy acrylate, sensitizer, epoxy compound, epoxy curing agent is disclosed in Japanese Patent Provisional Publication No. 50-144431 and Japanese Patent Publication No. 51-40451. In the case of these solder masks, the unexposed areas are removed and developed by an organic solvent. However, there are the risks of environmental pollution, fire and so on since a large amount of the organic solvent is used in the removal (development) of the unexposed areas. In particular, regarding the problem of environmental pollution the influences on the human body have been given a great deal of attention recently and it is the real state that we attempt with difficulty to seek for any countermeasures against this problem.

In order to solve this problem, an alkali developing type photoimageable solder mask capable of development by a dilute alkali aqueous solution is proposed.

As for an ultraviolet curing agent capable of alkali development, a material consisting of a reaction product as a base polymer, which is obtained by reacting epoxy resin with unsaturated monocarboxylic acid followed by adding polybasic acid anhydride, is disclosed in Japanese Patent Publication Nos. 56-40329 and 57-45785. In addition, a liquid solder mask composition using a novolak-type epoxy resin, which is superior in heat and chemical resistance, can be developed by a dilute alkali aqueous solution and is disclosed in Japanese Patent Provisional Publication No. 61-243869.

However, the above mentioned solder mask compositions have problems in that after application they induce developing failure because of the advancement of the heat curing at the time of drying, and they cause electrolytic corrosion and discoloration of the surface of copper foil, depending on the combinations of polybasic acid anhydride, which is employed in order to make the mask soluble in alkali developer, epoxy resin and epoxy resin curing agent. The compositions also have the problem of deteriorating the electrical characteristics of the board due to the influence of the carboxylic acid produced by the reaction of polybasic acid anhydride. In addition, their usage is restricted because deterioration of heat resistance and adhesion are induced when the mixing rate of epoxy resin, i.e., the heat curing component used to obtain the features as a solder mask, is small, and difficulty in developing in the dilute alkali solution is induced when the mixing rate of epoxy resin is large. Furthermore, there are additional problems with the above mentioned solder mask compositions in that they take a long exposure time because of the slowness of the curing by ultraviolet rays and sufficient heat resistance has still not been obtained.

SUMMARY OF THE INVENTION

The purpose of the present invention is to eliminate the above problems of prior art and to provide a photopolymerizable composition useful as a liquid photoimageable solder mask which has a superior ultraviolet curability, heat and chemical resistance, flexibility, electrical characteristics, and which is possible to develop by a dilute alkali aqueous solution.

The photopolymerizable composition of the present invention, which can be developed by a dilute alkali aqueous solution, comprises (a) a reaction product obtained by reacting epoxy resin A containing at least two terminated epoxy groups with 0.8 to 1.2 mol, per 1 epoxy equivalent of epoxy resin A, of $\alpha,\beta$-unsaturated carboxylic acid and then reacting same with 0.2 to 1.0 mol, per 1 epoxy equivalent of epoxy resin A, of polybasic acid anhydride, (b) diluent, (c) sensitizer, (d) epoxy resin B consisting of tris (2,3-epoxypropyl) isocyanurate whose melting point is 130° C. or less, and (e) epoxy resin curing agent represented as a general formula [I]:

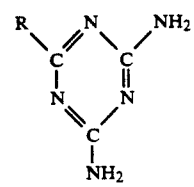

[R is —H, —NH$_2$, —SH, aromatic hydrocarbon, alkyl group having carbon atoms 1 to 4, NHR' (R'; alkyl group having carbon atoms 1 to 4, —CN or

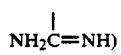

or halogen].

DETAILED DESCRIPTION OF THE INVENTION

No specific restriction is determined in the epoxy resin A having at least two of the terminated epoxy groups used in the reaction product component (a), but the novolak-type epoxy resin represented as the general formula [II]:

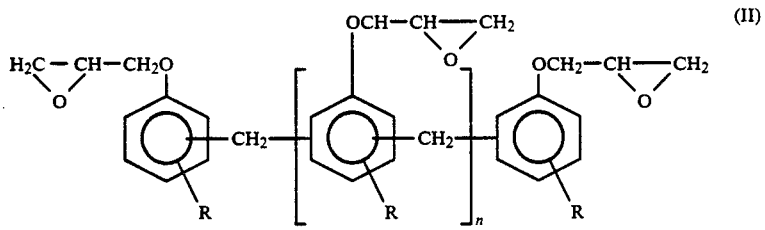

(R is hydrogen atom or methyl group) is favorable and a resin whose softening point is 65°–90° C. is even more desirable. When a photoimageable solder mask is prepared using an epoxy resin whose softening point is less than 65° C., the solder mask may attach to an art work film at the time of exposure because it is tacky at room temperature even after this solder mask is applied and dried and uneven brightness may be caused at the surface of the cured solder mask.

In addition, when an epoxy resin with a softening point of more than 90° C. is used, removal by a dilute alkali aqueous solution may be difficult.

As for commercially available novolak-type epoxy resin of above described general formula [II], Epikote® 180S70 (Petroch Chemical Shell Epoxy, Inc.); Epiclon® N-670, N-673, N-680, N-690 and N-775 (Dainippon Ink and Chemicals, Inc.); ECN-1273® and ECN-1280® (Ciba Geigey Co.) and so on, can be cited.

As for the epoxy resin used in the component of (a), the mixture of a novolak-type epoxy resin (softening point, 65°–90° C.) represented as above described general formula [II] and a bisphenol type epoxy resin (softening point, 65°–130° C.) represented as a general formula [III]:

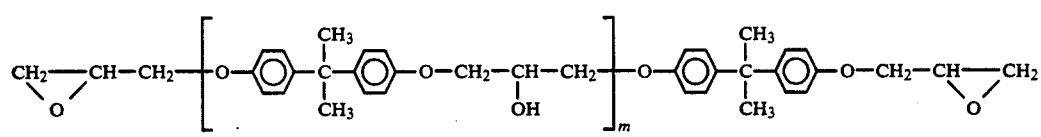

are also desirable. In this case, it is preferred that a novolak-type epoxy resin and a bisphenol type epoxy resin are mixed at a weight ratio of from 95:5 to 50:50. When the photoimageable solder mask is prepared using these two kinds of epoxy resins whose softening points are too low, the solder mask may attach to an art work film at the time of exposure because it is tacky at room temperature even after this solder mask is applied and dried and uneven brightness may be caused at the surface of the cured solder mask. In contrast, when the photoimageable solder mask is prepared using these two kinds of epoxy resins whose softening points are too high, removal by a dilute alkali aqueous solution may be difficult.

A photoimageable solder mask having superior heat resistance, adhesion and flexibility, can be obtained by using a combination of the epoxy resins represented by the general formulas [II] and [III]. However, adhesion and flexibility tend to be poor when the mixing rate of the epoxy resin of general formula [III] is too small, and conversely its heat resistance tends to be poor when its mixing rate is too large.

As for the commercially available epoxy resins represented by the general formula [III], Epikote® 1001, 1004 and 1007 (Petrochemical Shell Epoxy, Inc.); Epiclon® 1050, 4050 and 7050 (Dainippon Ink and Chemicals, Inc.); Araldite® 6071, 7072 and 7097 (Ciba Geigey Co.) and so on, can be cited.

As for the polymerizable unsaturated carboxylic acid, or α,β-unsaturated carboxylic acid, acrylic acid, methacrylic acid, crotonic acid, cinnamic acid and so on, can be cited, but acrylic acid is more favorable.

It is supposed that esterification is induced by the following reaction of the epoxy groups in epoxy resin with polymerizable unsaturated carbonic acid. Hence, epoxy resin and polymerizable unsaturated carboxylic acid are used in the amounts substantially corresponding to the number of the epoxy groups and the number of the polymeric unsaturated groups. Specifically, 0.8–1.2 mol or polymerizable unsaturated carboxylic acid is used per 1 epoxy equivalent of the epoxy resin.

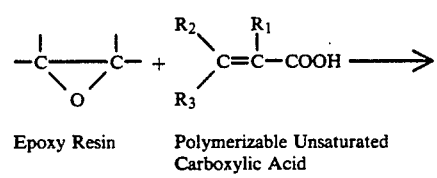

Epoxy Resin        Polymerizable Unsaturated
                   Carboxylic Acid

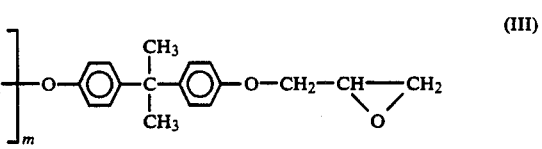

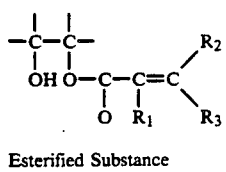

Esterified Substance ($R_1$, $R_2$, $R_3$ are each Hydrogen, alkyl group or aryl group)

As for the polybasic acid anhydride which is reacted with the esterified substance, hexahydrophthalic acid anhydride, 3-methyl hexahydrophthalic acid anhydride, 4-methyl hexahydrophthalic acid anhydride, 3-ethyl hexahydrophthalic acid anhydride, 4-ethyl hexahydrophthalic acid anhydride, tetrahydrophthalic acid anhydride, 3-methyl tetrahydrophthalic acid anhydride, 4-methyl tetrahydrophthalic acid anhydride, 3-ethyl tetrahydrophthalic acid anhydride, 4-ethyl tetrahydrophthalic acid anhydride, and so on are desirable, considering the developing ability and the reactivity with the epoxy resin which is a heat curing component.

Specifically, 0.2-1.0 mol of these polybasic acid anhydride is used per 1 epoxy equivalent of aforementioned epoxy resin.

The component (a) can be synthesized by reacting a specified amount of epoxy resin A with a specified amount of $\alpha,\beta$-unsaturated carboxylic acid in a suitable solvent to form an esterified substance followed by adding and reacting a specified amount of polybasic acid anhydride with the esterified substance. The reaction temperatures of both reactions are usually about 80° to 130° C. Some Synthesis Examples are shown as follows.

SYNTHESIS EXAMPLE 1

A cresol novolak-type epoxy resin (softening point: 74°-83° C. epoxy equivalent: 215) was reacted with 1 mol, per 1 epoxy equivalent of the epoxy resin, of acrylic acid in 30 wt. % of butyl cellosolve acetate as a solvent and novolak-type epoxy acrylate was obtained. A 0.5 mol of tetrahydrophthalic acid anhydride per 1 epoxy equivalent of the epoxy acrylate was added and reacted until the acid value became the theoretical value. This reaction product is defined as (a-1).

SYNTHESIS EXAMPLE 2

The reaction product (a-2) was obtained by the same method as Synthesis Example 1 except that bisphenol type epoxy resin (softening point: 97° C., epoxy equivalent: 925) was used instead of cresol novolak-type epoxy resin.

SYNTHESIS EXAMPLE 3

The reaction product (a-3) was obtained by the same method as Synthesis Example 1 except that 0.5 mol of maleic acid anhydride was used instead of tetrahydrophthalic acid anhydride.

SYNTHESIS EXAMPLE 4

The reaction product (a-4) was obtained by the same method as Synthesis Example 1 except that cresol novolak-type epoxy resin (softening point: 62°-68° C.) was used instead of cresol novolak-type epoxy resin (softening point: 74°-83° C.).

SYNTHESIS EXAMPLE 5

The reaction product (a-5) was obtained by the same method as Synthesis Example 1 except that 0.5 mol of hexahydrophthalic acid anhydride was used instead of tetrahydrophthalic acid anhydride.

Unsaturated compounds having at least two ethylene bonds, organic solvents, and so on, can be cited as the diluent (b) component of the present invention, and in particular it is favorable to use in combination with both the unsaturated compounds and the solvents. As for the aforementioned unsaturated compounds, ethyleneglycol di(metha) acrylate, diethyleneglycol di(metha) acrylate, glycerin tri(metha) acrylate, 1,3-propylene di(metha) acrylate, 1,2,4-butanetriol tri(metha) acrylate, 1,4-benzenediol di(metha) acrylate, bis(metha) acrylate of polyethyleneglycol having 200-500 of molecular weight, trimethylolpropane tri(metha) acrylate, pentaerythritol tetra(metha) acrylate, dipentaerythritol hexa(metha) acrylate, methylenebis(metha) acrylamide, diethylenetriamine tri(metha) acrylamide-bis(methacryl amidopropoxy) ethane, bismethacrylamide ethylmethacrylate, N-[($\beta$-hydroxyethyloxy) ethyl ] acrylamide, divinyl phthalate, divinyl telephthalate, divinyl benzene-1,3-disulfonate, divinyl butane-1,4-disulfonate, triallyl isocyanurate, tri(metha) acryl isocyanurate, xylylene bis (diallyl isocyanurate), tris (2,3-dibromopropyl) isocyanurate, tris (3-mercaptopropyl) isocyanurate, and so on, and as for the organic solvents, ethyleneglycol monoalkylethers, the type of diethyleneglycol monoalkylether, ethyleneglycol dialkylethers, diethyleneglycol dialkylethers, ethyleneglycol monoalkylether acetates, diethyleneglycol monoalkylether acetates, cyclohexanone, tetrahydronaphthalene, petroleum naphtha, and so on, are used for the purpose of diluting into the applicable condition.

The sensitizer, (c) component of the present invention is not restricted to the specific substances, but superior ultraviolet rays curability is especially obtained by using in combination with 2-methyl-[4-(methylthio) phenyl]-2-morpholino-1-propanone as the main component, one or two other kinds of sensitizers. As for the sensitizers used in the aforementioned combination, p-phenylbenzophenone, benzyl dimethyl ketal, 2,4-dimethyl thioxanthon, 2-isopropyl thioxanthon, benzoin ethylether, benzoin isopropylether, benzoin isobutylether, 4,4'-diethylamino benzophenone, p-dimethylamino benzoic acid ethylester, and so on, can be cited.

The epoxy resin B, (d) component of this invention, consists of tris(2,3-epoxy propyl)isocyanurate. This epoxy resin has the characteristics of high stability at low temperatures and high reactivity at high temperatures since it is hardly soluble in the organic solvent when compared with that of general epoxy resins of epibis- or novolak-type. In addition, it is superior in heat resistance and electrical characteristics because it has the triazine skeleton. However, since the melting point is usually 90° to 156° C., the epoxy resin does not react completely at the time of exposure and at post curing after developing and does not show satisfactory characteristics when the melting point exceeds 130° C.

The epoxy resin curing agent, the (e) component of this invention, is S-triazine compounds represented by the general formula [I]:

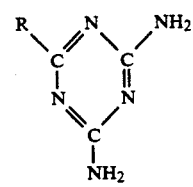

[R is —H, —NH$_2$, —SH, aromatic hydrocarbon, alkyl group having carbon atoms 1 to 4, NHR' (R': alkyl group having carbon atoms 1 to 4, —CN or $$NH_2C=NH)$$

or halogen].

Melamine, guanamine, acetoguanamine, benzoguanamine, ethyldiamino-S-triazine, 2,4-diamino-S-triazine, 2,4-diamino-6-tolyl-S-triazine, 2,4-diamino-6-xylyl-S-triazine, and similar products can be cited as examples. These S-triazine compounds not only act as the latent hardener of the epoxy resin but also have the effect of strengthening the adhesion of the resist to the board and of preventing electrolytic corrosion and discoloration of the copper foil.

As described above, the photopolymerizable composition of this invention consists of the components (a), (b), (c), (d) and (e). The following mixing ratios are favorable. That is (a): 40–60 wt. % of the react product, (b): 10–50 wt. % of the diluent (it is especially desirable that it contain 1–5 wt. % of unsaturated compounds), (c): 3–10 wt. % of the sensitizer, (d): 10–20 wt. % of the epoxy resin B, and (e): 0.5–3 wt. % of the epoxy resin curing agent. The various kinds of additives, for example, extender pigments such as silica, talc, alumina, calcium carbonate, clay, aerosil and so on, color pigments such as chrome phthaloyellow, cyanine green and so on, antifoaming agent such as silicones and the types of fluorine, leveling agents, antioxidants and so on may be added as needed.

In order to use the above described photopolymerizable composition of this invention as a solder mask, the organic solvent is vaporized by heating for 15 to 60 minutes at 60° to 80° C. after coating of this composition on the board at a specified thickness. Next, the specified pattern whose image area is transparent is put on the coated film of the board so that it is in contact with the art work film, and the described pattern is selectively exposed by irradiating it with ultraviolet rays. The composition of the exposed film is made insoluble by the formation of cross-linkage. Finally the coated film is developed by removing the unexposed areas with a dilute alkali aqueous solution. For the dilute aqueous solution used in this procedure, 0.5 to 5 wt. % of sodium carbonate aqueous solution is commonly used. Of course other kinds of alkali solution are also available. It is desirable that the patterns obtained by these procedures be reacted (secondary cure) with ultraviolet rays, at a temperature of 100° to 200° C., or extreme infrared rays, to improve heat resistance.

EXAMPLES

The invention is described hereinafter in connection with some examples However, the invention is not limited to these examples. Examples 1–2 and Comparative Example 1–8

The components shown in the following Table 1 were mixed and kneaded by a roll mill to produce a solder mask. The amounts of each component is represented by wt. %.

TABLE 1

|  | Example | | Comparative Example | | | | | | | |
|---|---|---|---|---|---|---|---|---|---|---|
|  | 1 | 2 | 1 | 2 | 3 | 4 | 5 | 6 | 7 | 8 |
| (a) component |  |  |  |  |  |  |  |  |  |  |
| (a-1) | 60 |  | 60 | 60 | 60 | 60 |  |  | 60 | 60 |
| (a-5) |  | 60 |  |  |  |  |  |  |  |  |
| (a-3) |  |  |  |  |  |  | 60 |  |  |  |
| (a-4) |  |  |  |  |  |  |  | 60 |  |  |
| 2-methyl-[4-(methylthio)phenyl]-2-morfolino-1-propanone | 4 | 4 | 4 | 4 | 4 | 4 | 4 | 4 |  |  |
| 2-ethylanthraquinone |  |  |  |  |  |  |  |  | 4.5 | 4.5 |
| diethylaminobenzophenone | 0.5 | 0.5 | 0.5 | 0.5 | 0.5 | 0.5 | 0.5 | 0.5 |  | 0.5 |
| pentaerythritol tetraacrylate | 2 | 2 | 2 | 2 | 2 | 2 | 2 | 2 | 2 | 2 |
| KS-66[1] | 1 | 1 | 1 | 1 | 1 | 1 | 1 | 1 | 1 | 1 |
| epoxy resin B [tris(2,3-epoxy propyl) isocyanurate] |  |  |  |  |  |  |  |  |  |  |
| m.p. 100–120° C. | 10 | 10 |  |  | 10 | 10 | 10 | 10 | 10 | 10 |
| m.p. 150–156° C. |  |  | 10 |  |  |  |  |  |  |  |
| cresol novolak-type epoxy resin |  |  |  | 10 |  |  |  |  |  |  |
| acetoguanamine | 1 | 1 | 1 | 1 |  |  | 1 | 1 | 1 | 1 |
| dicyandiamide |  |  |  |  | 1 |  |  |  |  |  |
| 2P4MHZ[2] |  |  |  |  |  | 1 |  |  |  |  |
| silica | 10 | 10 | 10 | 10 | 10 | 10 | 10 | 10 | 10 | 10 |
| Cyanine Green | 0.5 | 0.5 | 0.5 | 0.5 | 0.5 | 0.5 | 0.5 | 0.5 | 0.5 | 0.5 |
| butyl cellosolve acetate | 11 | 11 | 11 | 11 | 11 | 11 | 11 | 11 | 11 | 10.5 |
| Total | 100 | 100 | 100 | 100 | 100 | 100 | 100 | 100 | 100 | 100 |

[1] Shin-Etsu Chemical Co., Ltd., silicone antifoaming agent
[2] 2-phenyl-4-methyl-5-hydroxymethyl imidazole The photoimageable solder mask of Examples 1 to 2 and Comparative Examples 1 to 8 were coated on the whole surface of a copper-clad laminate on which a processed pattern was formed by screen printing at a thickness of 20–30 μm. Then the laminate was dried by a hot air recycle type dryer at 80° C. for 30 minutes to produce the solder mask film, in contact with an art work film having a desired pattern, exposed to ultraviolet rays having an intensity of 25 mW/cm² at a wavelength of 365 nm for 20 seconds. Then it was developed in 1% sodium carbonate aqueous solution for 60 seconds and cured by heat using the hot air recycle type dryer at 150° C. for 30 minutes. The obtained sample was evaluated for tackiness after drying, developability, the condition of the coated film after development, adhesion, film hardness, solder heat resistance, electrolytic corrosion and the discoloration of the copper foil. The results obtained are shown in Table 2.

TABLE 2

|  | Example | | Comparative Example | | | | | | | |
|---|---|---|---|---|---|---|---|---|---|---|
|  | 1 | 2 | 1 | 2 | 3 | 4 | 5 | 6 | 7 | 8 |
| Tackiness after drying | ○ | ○ | ○ | ○ | ○ | ○ | ○ | X | ○ | ○ |
| Developability | ○ | ○ | ○ | ○ | ○ | ○ | X | — | ○ | ○ |
| Condition of coated film after development | ○ | ○ | ○ | ○ | ○ | ○ | — | — | X | X |
| Adhesion | ○ | ○ | ○ | ○ | ○ | ○ | — | — | — | — |

TABLE 2-continued

|  | Example | | Comparative Example | | | | | | | |
|---|---|---|---|---|---|---|---|---|---|---|
|  | 1 | 2 | 1 | 2 | 3 | 4 | 5 | 6 | 7 | 8 |
| Hardness of Coated Film | 5H | 5H | 5H | 5H | 5H | 5H | — | — | — | — |
| Solder heat resistance | | | | | | | | | | |
| 1 cycle | O | O | O | O | O | O | — | — | — | — |
| 3 cycles | O | O | Δ | X | O | O | — | — | — | — |
| Electrolytic corrosion | O | O | O | O | X | X | — | — | — | — |
| Discoloration of copper foil | O | O | O | O | X | X | — | — | — | — |

The evaluation of the above described characteristics are performed under the following conditions.

Tackiness after drying

After drying, the tackiness of the coated film was examined by touch and evaluated by the following criteria.
O: No tackiness
Δ: Slight tackiness
X: Significant tackiness Developability Development was performed by spraying 1% sodium carbonate aqueous solution at a temperature of 30° C. onto the coated film at a spray pressure of 0.7 kg/cm$^2$ for 60 sec, and evaluated by the following criteria.
O: Completely developed
Δ: A small amount of mask remained
X: Hardly developed The condition of the coated film after development The condition of the coated film after development is evaluated by the following criteria.
O: No abnormality in the coated film
X: Bulging or blistering on the coated film Adhesion One hundred cross-cuts (10×10) were made on the coated film and the peeling test was performed using a cellophane tape (peeling after sticking the cellophane tape onto the coated film). The peeling of the cross-cut is evaluated by the following criteria.
O: 100/100
Δ: 50/100–90/100
X: 0/100–50/100

Hardness of the coated film

The pencil hardness of the coated film is evaluated according to JIS D 0202.

Solder Heat Resistance

The peeling test was performed using cellophane tape after dipping the sample in a solder bath at 260° C. for 30 seconds. A single test was defined as one cycle, and the solder heat resistance was evaluated by the following criteria after one and three cycles.
O: No abnormality in the coated film
Δ: Slight bulging or blistering on the coated film
X: Bulging or blistering on the coated film Electrolytic Corrosion A sample using, as the board, the tandem-type electrodes of the IPC-SM-840A B-25 test coupon is impressed at DC 100V in the constant temperature and humidity bath (60° C., 90% RH) for 300 hours, and the presence or absence of a electrolytic corrosion is checked for.
O: No corrosion
X: Corrosion observed Discoloration of Copper foil The sample using, as the board, the tandem-type electrodes of the IPC-SM-840A B-25 test coupon is placed in the constant temperature and humidity bath (60° C., 90% RH) for 300 hours, and the presence or absence of the discoloration of copper foil is checked for.
O: No discoloration
X: Discoloration observed

EXAMPLES 3–4 AND COMPARATIVE EXAMPLES 9–15

The components shown in the following Table 3 were mixed and kneaded by a roll mill to produce a solder mask.

TABLE 3

|  | Example | | Comparative Example | | | | | | |
|---|---|---|---|---|---|---|---|---|---|
|  | 3 | 4 | 9 | 10 | 11 | 12 | 13 | 14 | 15 |
| (a) component | | | | | | | | | |
| (a-1) | 63 | 42 | 63 | 63 | 63 | 70 |  |  |  |
| (a-2) | 7 | 28 | 7 | 7 | 7 |  | 70 | 7 | 7 |
| (a-3) |  |  |  |  |  |  |  | 63 |  |
| (a-4) |  |  |  |  |  |  |  |  | 63 |
| 2-methyl-[4-(methylthio)phenyl]-2-morfolino-1-propanone | 4 | 4 | 4 | 4 | 4 | 4 | 4 | 4 | 4 |
| diethylaminobenzophenone | 0.5 | 0.5 | 0.5 | 0.5 | 0.5 | 0.5 | 0.5 | 0.5 | 0.5 |
| pentaerythritol tetraacrylate | 2 | 2 | 2 | 2 | 2 | 2 | 2 | 2 | 2 |
| KS-66 | 1 | 1 | 1 | 1 | 1 | 1 | 1 | 1 | 1 |
| epoxy resin B [tris(2,3-epoxy propyl) isocyanurate] | | | | | | | | | |
| m.p. 100–120° C. | 10 | 10 |  |  | 10 | 10 | 10 | 10 | 10 |
| m.p. 150–156° C. |  | 10 |  |  |  |  |  |  |  |
| cresol novolak-type epoxy resin |  |  | 10 |  |  |  |  |  |  |
| acetoguanamine | 1 | 1 | 1 | 1 |  | 1 | 1 | 1 | 1 |
| dicyandiamide |  |  |  |  | 1 |  |  |  |  |
| silica | 11 | 11 | 11 | 11 | 11 | 11 | 11 | 11 | 11 |
| Cyanine Green | 0.5 | 0.5 | 0.5 | 0.5 | 0.5 | 0.5 | 0.5 | 0.5 | 0.5 |

TABLE 3-continued

| | Example | | Comparative Example | | | | | | |
|---|---|---|---|---|---|---|---|---|---|
| | 3 | 4 | 9 | 10 | 11 | 12 | 13 | 14 | 15 |
| Total | 100 | 100 | 100 | 100 | 100 | 100 | 100 | 100 | 100 |

The photoimageable solder mask of Examples 3, 4 and Comparative Examples 9 to 15 were coated on the whole surface of the copper-clad laminate on which a processed pattern was formed by screen printing at a thickness of 20–30 μm. Then the laminate was dried by a hot air recycle type dryer at 80° C. for 30 minutes to produce the solder mask film, in contact with an art work film having a desired pattern, and exposed to ultraviolet rays having an intensity of 25 mW/cm$^2$ at a wavelength of 365 nm for 20 seconds. Then it was developed in 1% sodium carbonate aqueous solution for 60 seconds and cured by heat using the hot air recycle type dryer at 150° C. for 30 minutes. The obtained sample was evaluated for tackiness after drying, developability, the condition of the coated film after development, adhesion, impart resistance, film hardness, solder heat resistance, electrolytic corrosion and discoloration of the copper foil. In this connection, the impact resistance was determined according to JIS K-5400, in which O denotes "No crack or peeling on the coated film" and X denotes "Crack or peeling on the coated film observed".

The results obtained are shown in Table 4.

TABLE 4

| | Example | | Comparative Example | | | | | | |
|---|---|---|---|---|---|---|---|---|---|
| | 3 | 4 | 9 | 10 | 11 | 12 | 13 | 14 | 15 |
| Tackiness after drying | O | O | O | O | O | O | O | | X |
| Developability | O | O | O | O | O | O | X | — | |
| Condition of coated film after development | O | O | O | O | O | O | O | — | — |
| Adhesion | O | O | O | O | O | O | O | — | — |
| impact resistance | O | O | O | O | O | X | O | — | — |
| Hardness of Coated Film | 5H | 5H | 5H | 5H | 5H | 5H | 5H | — | — |
| Solder heat resistance | | | | | | | | | |
| 1 cycle | O | O | O | O | O | O | O | — | — |
| 3 cycles | O | O | Δ | X | O | O | X | — | — |
| Electrolytic corrosion | O | O | O | X | O | O | — | — | |
| Discoloration of copper foil | O | O | O | X | O | O | — | — | |

What is claimed is:

1. A photopolymerizable composition which comprises:
   (a) a reaction product obtained by reacting an epoxy resin A containing at least two terminated epoxy groups with 0.8 to 1.2 mol, for each epoxy equivalent of epoxy resin A of an α,β-unsaturated carboxylic acid to form an esterified substance and then reacting the esterified substance with 0.2 to 1.0 mol, for each epoxy equivalent of epoxy resin A, of polybasic acid anhydride,
   (b) diluent,
   (c) sensitizer,
   (d) epoxy resin B consisting of tris (2,3-epoxypropyl) isocyanurate having a melting point in the range of 90°–130° C., and
   (e) an epoxy resin curing agent represented by the general formula (I):

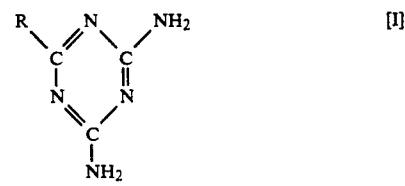

wherein R is —, H, halogen —NH$_2$, —SH, an aromatic hydrocarbon, a C$_1$–C$_4$ alkyl or NHR' wherein R' is a C$_1$–C$_4$ alkyl, —CN or NH$_2$C=NH.

2. The composition of claim 1 comprising 40–60 wt. % of said (a) component, 10–50 wt. % of said (b) component, 3–10 wt. % of said (c) component, 10–20 wt. % of said (d) component, and 0.5–3 wt. % of said (e) component.

3. The composition of claim 1 or 2 wherein said epoxy resin A of said (a) component is a novolak-type epoxy resin whose melting point is 65°–90° C. and is represented by the general formula (II):

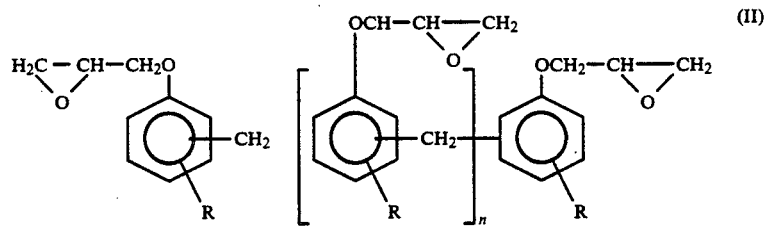

wherein R is hydrogen or methyl.

4. The composition of claim 1 or 2 wherein said epoxy resin A of said (a) component is a mixture of novolak-type epoxy resin whose melting point is 65°–90° C. and is represented by the general formula:

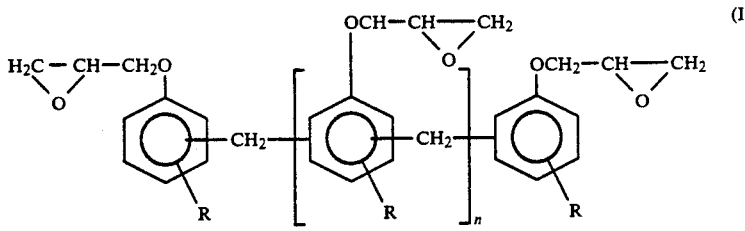
(II)

wherein R is hydrogen or methyl and,
a bisphenol type epoxy resin whose melting point is 65°–130° C. and is represented by formula:

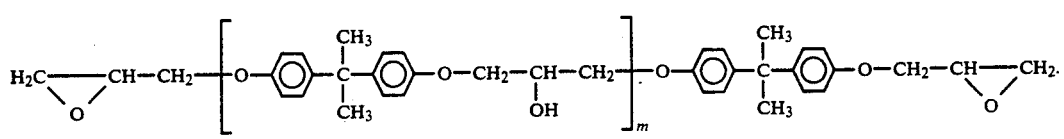
(III)

5. The composition of claim 4 wherein a weight ratio range of the novolak-type epoxy resin and the bisphenol type epoxy resin is 95:5 to 50:50.

6. The composition of claim 1 capable of being developed by a dilute alkali aqueous solution.

7. The composition of claim 1 wherein the $\alpha,\beta$ unsaturated carboxylic acid is selected from the group consisting of acrylic acid, methacrylic acid, crotonic acid and cinnamic acid.

8. The composition of claim 1 wherein the $\alpha,\beta$-unsaturated carboxylic acid is acrylic acid.

9. The composition of claim 1 wherein the polybasic acid anhydride is selected from the group consisting of hexahydrophthalic acid anhydride, 3-methyl hexahydrophthalic acid anhydride, 4-methyl hexahydrophthalic acid anhydride, 3-ethyl hexahydrophthalic acid anhydride, 4-ethyl hexahydrophthalic acid anhydride, tetrahydrophthalic acid anhydride, 3-methyl tetrahydrophthalic acid anhydride, 4-methyl tetrahydrophthalic acid anhydride, 3-ethyl tetrahydrophthalic acid anhydride and 4-ethyl tetrahydrophthalic acid anhydride.

10. The composition of claim 1 wherein the diluent is unsaturated compound or an organic solvent.

11. The composition of claim 1 wherein the diluent comprises 1–5% unsaturated compounds.

12. The composition of claim 1 wherein the sensitizer comprises the combination of 2-methyl-{4-(methylthio) phenyl}-2-morpholino-1-propanone with one or two of the compounds selected from the group consisting of p-phenylbenzophenone, benzyl dimethyl ketal, 2,4-dimethyl thioxanthone, 2-isopropyl thioxanthone-benzoin ethylether, benzoin isopropylether, benzoin isobutylether, 4,4'-diethylamino benzophenone and p-dimethylamino benzoic acid ethylester.

13. The composition of claim 1 wherein the curing agent is selected from the group consisting of melamine, guanamine, acetoguanamine, benzoguanamine, ethyldiamino-S-triazine, 2,4-diamino-S-triazine, 2,4-diamino-6-Xylyl-5-triazine and 2,4-diamino-6tolyl-S-triazine.

14. The composition of claim 1 wherein the diluent is selected from the group consisting of ethyleneglycol dimethacrylate, diethyleneglycol dimethacrylate, glycreine trimethacrylate, 1,3-propylene dimethacrylate, 1,2,4-butanetriol trimethacrylate, 1,4-benzenediol dimethacrylate, bismethacrylate of polyethyleneglycol of 200–500 molecular weight, trimethylolpropane trimethacrylate, pentaerythritol tetramethacrylate, dipentaerythritol hexamethacrylate, methylenebismethacrylamide, diethylenetriamine trimetharylamide-bis(methacryl amidopropoxy) ethane, bismethacrylamide ethylmethacrylate, N-[($\beta$-hydroxyethyloxy) ethyl ] acrylamide, divinyl phthalate, divinyl telephthalate, divinyl benzene-1,3-disulfonate, divinylbutane-1,4-disulfonate, triallyl isocyanurate, trimethacryl isocyanurate, xylylene bis (diallyl isocyanurate), tris (2,3-dibromopropyl) isocyanurate, tris (3-mercaptopropyl isocyanurate, ethyleneglycol monoalkylethers, diethyleneglycol monoalkylether, ethyleneglycol dialkylethers, diethyleneglycol dialkylethers, ethyleneglycol monoalkylether acetates, diethyleneglycol monoalkylether acetates, cyclohexanone, tetrahydronaphthalene, and petroleum naphtha.

* * * * *

UNITED STATES PATENT AND TRADEMARK OFFICE
CERTIFICATE OF CORRECTION

PATENT NO. : 5,100,767
DATED      : March 31, 1992
INVENTOR(S): Makoto Yanagawa, et al.

It is certified that error appears in the above-identified patent and that said Letters Patent is hereby corrected as shown below:

Col. 1, line 42:    before "have" first word delete ".".

Col. 14, line 31:
    Claim 14        lines 3-4 (bridge) delete "glycreine" and insert -- glycerine --.

Col. 14, line 38:
    Claim 14        line 10, delete "trimetharylamide-" and insert -- trimethacrylamide --.

Signed and Sealed this

Twenty-first Day of September, 1993

Attest:

BRUCE LEHMAN

*Attesting Officer*    Commissioner of Patents and Trademarks